(12) United States Patent
Ootera et al.

(10) Patent No.: US 9,050,752 B2
(45) Date of Patent: Jun. 9, 2015

(54) IMPRINT METHOD

(71) Applicant: KABUSHIKI KAISHA TOSHIBA, Tokyo (JP)

(72) Inventors: Yasuaki Ootera, Yokohama (JP); Yoshiyuki Kamata, Tokyo (JP); Naoko Kihara, Kawasaki (JP); Yoshiaki Kawamonzen, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/083,592

(22) Filed: Nov. 19, 2013

(65) Prior Publication Data

US 2014/0138354 A1 May 22, 2014

(30) Foreign Application Priority Data

Nov. 20, 2012 (JP) .................................. 2012-254508

(51) Int. Cl.
  *G03F 7/00* (2006.01)
  B29C 59/02 (2006.01)
  *G03F 7/027* (2006.01)
  *G03F 7/038* (2006.01)

(52) U.S. Cl.
  CPC ............ B29C 59/026 (2013.01); G03F 7/0002 (2013.01); *G03F 7/027* (2013.01); *G03F 7/038* (2013.01)

(58) Field of Classification Search
  None
  See application file for complete search history.

(56) References Cited

U.S. PATENT DOCUMENTS

| 2004/0250945 | A1* | 12/2004 | Zheng et al. | ............... 156/230 |
| 2008/0012184 | A1* | 1/2008 | Chou | ........................ 264/496 |
| 2011/0277922 | A1 | 11/2011 | Masuda et al. | |
| 2012/0126458 | A1* | 5/2012 | King et al. | ................. 264/219 |
| 2012/0217220 | A1* | 8/2012 | Dobisz et al. | ............... 216/41 |

FOREIGN PATENT DOCUMENTS

| JP | 2002-283354 | 10/2002 |
| JP | 2006-54300 | 2/2006 |
| JP | 2011-228674 | 11/2011 |
| WO | 2010/090088 | 8/2010 |

OTHER PUBLICATIONS

Office Action mailed Jul. 1, 2014 in counterpart Japanese Patent Application No. 2012-254508 and English-language translation thereof.

* cited by examiner

*Primary Examiner* — Shamim Ahmed
*Assistant Examiner* — Bradford Gates
(74) *Attorney, Agent, or Firm* — Nixon & Vanderhye, P.C.

(57) ABSTRACT

An imprint method according to this embodiment includes preparing a mold having a recessed portion, filling the recessed portion with a mold non-reactive material, pressing the mold against a resist which is applied on a base material, curing the resist in a state that the mold is pressed, and separating the mold from the base material. The mold non-reactive material is a material which does not chemically react with a material of the mold. By curing of the resist, the resist and the mold non-reactive material are coupled. When the mold is separated from the base material, the resist and the mold non-reactive material are left on the base material.

20 Claims, 7 Drawing Sheets

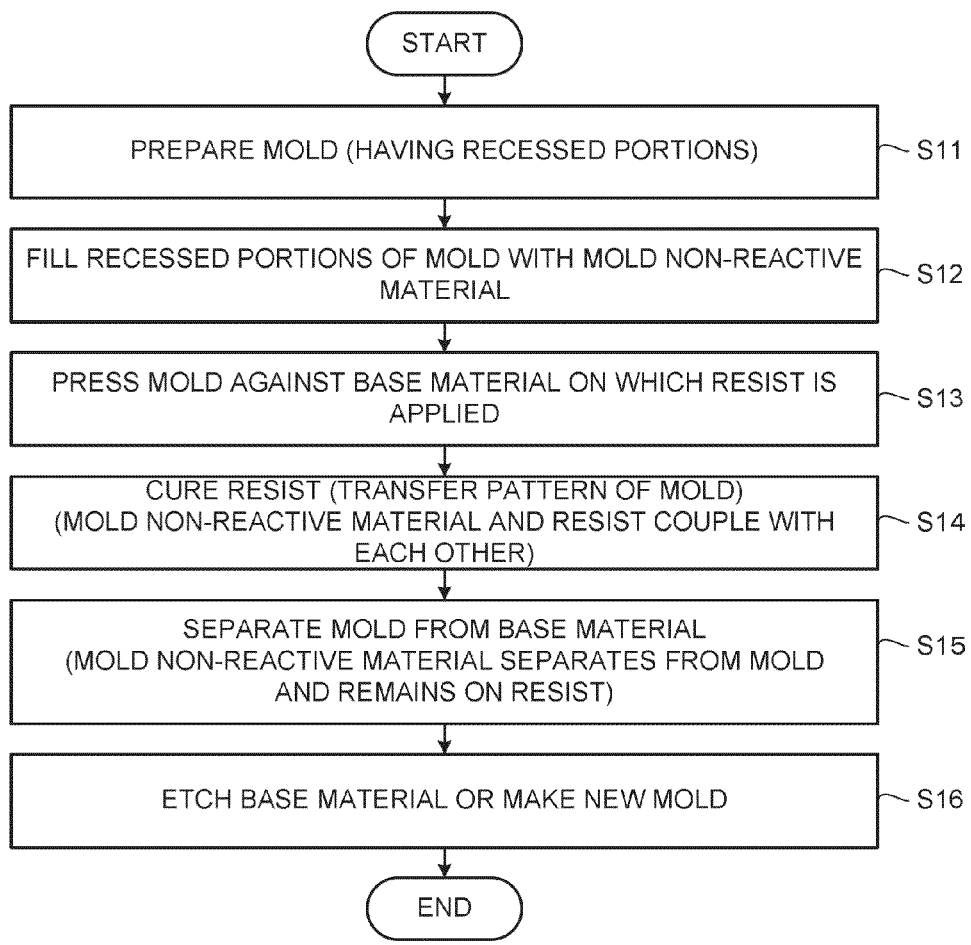

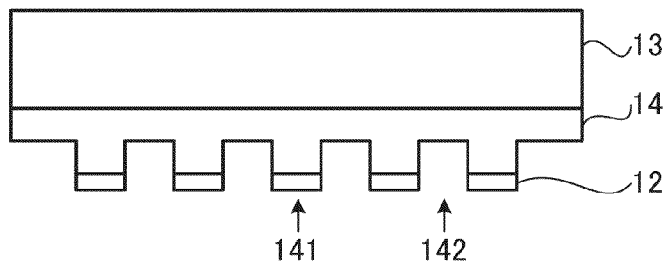
FIG. 5A
FIG. 5B
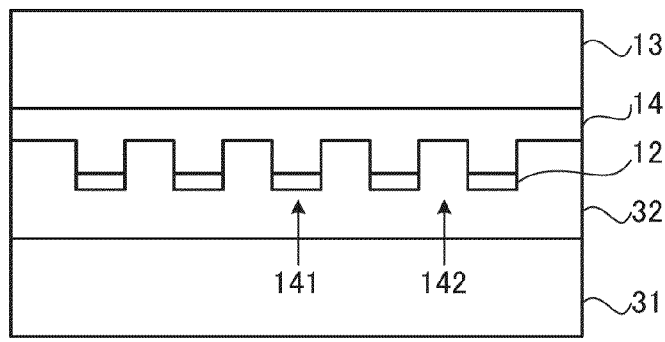
FIG. 5C
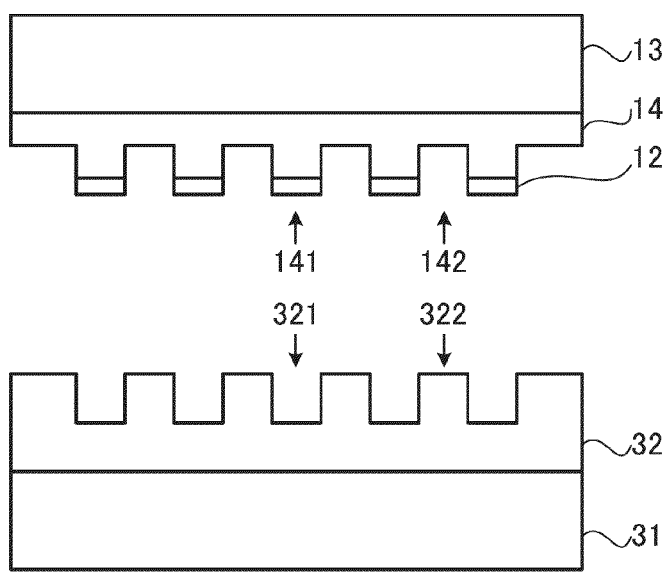

IMPRINT METHOD

CROSS REFERENCE TO RELATED APPLICATION

This application is based upon and claims the benefit of priority from Japanese Patent Application No. 2012-254508, filed on Nov. 20, 2012; the entire contents of which are incorporated herein by reference.

FIELD

Embodiments described herein relate generally to an imprint method.

BACKGROUND

Increase in recording density of magnetic recording devices (HDD) which record and reproduce information is demanded. As a measure for achieving high density of magnetic disks, bit patterned media (BPM) have been considered. A bit pattern medium has a magnetic film divided into numerous dots each corresponding to one bit. Consequently, it is possible to improve recording density while suppressing bit inversion due to thermal fluctuation. Further, a servo pattern can be formed together with dots on a magnetic film, which makes it unnecessary to record a servo signal separately, and hence can improve productivity.

In the manufacturing process of the BPM, a mold is pressed against a resist applied on a magnetic recording layer, so as to transfer a projecting and recessed pattern of the mold to the resist. With this patterned resist being a mask, the magnetic recording layer is processed.

Here, separating the mold from the patterned resist (mold release) is not always easy. It is possible that the resist adheres to the mold, and the mold release becomes difficult (decrease in mold release property). As a measure for this, it is conceivable to apply a release agent on the mold so as to prevent adhesion of the resist to the mold. However, when the projecting and recessed pattern of the mold is minute, precision of transfer of the pattern may decrease.

BRIEF DESCRIPTION OF THE DRAWINGS

FIG. 1 is a flowchart representing the procedure of an imprint method according to one embodiment.

FIGS. 5A-5C are cross-sectional views representing a step of imprint.

DETAILED DESCRIPTION

An imprint method according to this embodiment includes preparing a mold having a recessed portion, filling the recessed portion with a mold non-reactive material, pressing the mold against a resist which is applied on a base material, curing the resist in a state that the mold is pressed, and separating the mold from the base material. The mold non-reactive material is a material which does not chemically react with a material of the mold. By curing of the resist, the resist and the mold non-reactive material are coupled. When the mold is separated from the base material, the resist and the mold non-reactive material are left on the base material.

Hereinafter, embodiments will be described in detail with reference to the drawings.

FIG. 1 is a flowchart representing an imprint method according to one embodiment. FIG. 2A to FIG. 2E are cross-sectional views representing steps in this imprint method.

A. Preparation of a Mold 11 (Step S11, See FIG. 2A)

A mold 11 used for imprint is prepared. This mold 11 is, for example, the original of a patterned medium (BPM), and has minute recessed portions 111 and projecting portions 112.

The recessed portions 111 have, for example, a width (or diameter) of 5 nm to 100 nm (about several tens of nm). The projecting portions 112 have, for example, a width (or diameter) of 5 nm to 100 nm (about several tens of nm). When the mold 11 is for BPM, holes (recessed portions 111) correspond to dots of BPM and become an important pattern. When the recording density of BPM is 1 Tb/in$^2$ and 2 Tb/in$^2$, the diameters of these holes are about 15 nm and about 10 nm, respectively.

The mold 11 can be made by utilizing electron beam exposure or self-assembly of diblock copolymer in the following manner.

1. Making the Mold 11 Using Electron Beam Exposure (See FIG. 3A to FIG. 3C)

The mold 11 can be made as follows using electron beam exposure.

Figure 3A:
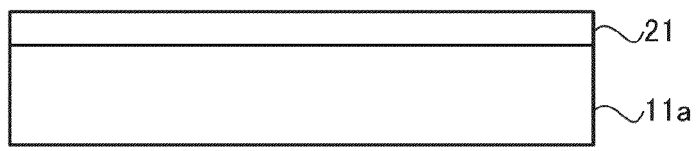
FIGS. 3A-3C are cross-sectional views representing a mold being made.
Figure 3B:
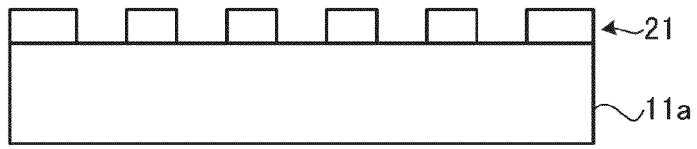

(1) A resist 21 is applied to a base material (for example, quartz, Si, or the like) 11a (see FIG. 3A).

(2) A pattern (for example, a BPM pattern (dot and servo pattern)) is exposed on a resist 21 by an electron beam and is developed. As a result, this resist 21 is patterned (see FIG. 3B).

Figure 2A:
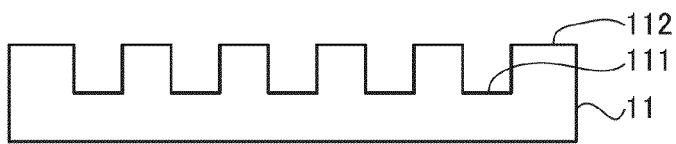
FIGS. 2A-2E are cross-sectional views representing a step of imprint.
Figure 2B:
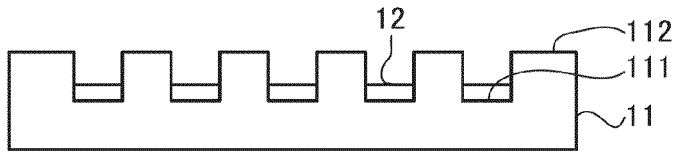
Figure 3C:
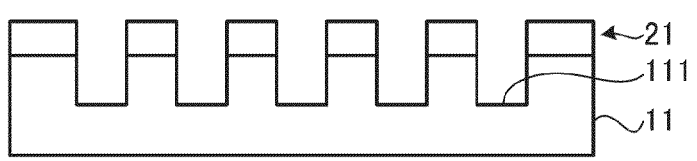

(3) Using the patterned resist 21 as a mask, the base material 11a as a base is processed, and the resist 21 is removed, thereby making the mold 11 (see FIG. 3C, FIG. 2A).

2. Making the Mold 11 Using Self-Assembly of Diblock Copolymer

Instead of the electron beam exposure, self-assembly of diblock copolymer can be used to make the mold 11.

(1) A diblock copolymer (PS (polystyrene)-PMMA (polymethyl methacrylate) or the like) is applied on a base material (for example, quartz or Si wafer).

(2) The diblock copolymer is made to self-assemble to form a pattern.

By bringing blocks (for example, PS, PMMA) in the diblock copolymer to a state of being easily movable (for example, by heating or adding a solvent), the diblock copolymer is made to self-assemble and separates into two phases (for example, PS phase and PMMA phase). Dots (cylinder shape or sphere shape) of a second phase are formed in a first phase.

(3) Using the self-assembled diblock copolymer as a mask, the base material 11a as a base is processed, thereby making the mold 11.

At this time, first, the self-assembled diblock copolymer is processed with oxygen plasma, so as to leave one of the two phases. Then, with the diblock copolymer processed with oxygen plasma being a mask, the base material 11a is etched, thereby making the mold 11.

B. Filling the Recessed Portions 111 of the Mold 11 with a Material 12 (Step S12, See FIG. 2B)

For example, by applying a solution containing a material 12 on the mold 11 by a spin coating method or a dipping method, the recessed portions 111 of the mold 11 are filled with a material (mold non-reactive material) 12.

This material 12 is a mold non-reactive material which does not chemically react with the material of the mold 11. As the material 12, (1) metal or a compound thereof (metal, metal oxide, metal complex), (2) silicon or a compound thereof, or (3) low-molecular weight organic compound (which does not have a reaction group which reacts with the material of the mold 11) can be used. Further, it is also necessary that the material 12 by itself does not undergo polymerization reaction or cross-linking reaction.

This material 12 couples to a resist 14, as will be described later, when the resist 14 cures, unlike what is called a release agent. Accordingly, the material 12 separates from the mold 11 when it is released and transfers to a base material 13 side (see FIG. 2E). As a result, this embodiment can achieve both a mold release property and a transfer property.

On the other hand, what is called a release agent remains on the mold side when it is released. Accordingly, the mold release property becomes good, but transfer precision of a pattern decreases due to that the pattern is embedded in the release agent (deterioration in transfer property).

When the pattern of the mold 11 is large (the depth and width of the recessed portions 111 are large), the transfer property would not be impaired largely even when a layer of the release agent (generally, having a thickness of 2 to 3 nm or more) is formed on the mold 11. However, when the depth and the width of the recessed portions 111 are, for example, about 10 nm or smaller, the pattern is embedded in the release agent, and accurate transfer of a minute pattern becomes difficult (deterioration in transfer property). That is, it is necessary that the layer of the release agent is sufficiently thin with respect to the depth and the width of the recessed portions 111.

Specifically, as the material 12, the following (1) to (3) are exemplified.
(1) Metal or a compound thereof (for example, Au, Ag, Cu, Al, Fe, Co, Pt, Ni, W, Mo or oxide or complex thereof)
(2) Silicon or a compound (silica-based compound: Si, $SiO_2$, silsesquioxane, SOG (spin-off glass), or the like)
(3) Low-molecular weight organic polymer which does not have a reaction group (vinyl group, epoxy group, amino group, metacryl group, mercapto group, oxetanyl group (methoxy group or ethoxy group)) which does not undergo radical polymerization or cation polymerization with the material of the mold 11.

The radical polymerization or the cation polymerization are started by, for example, irradiation with ultraviolet rays. Accordingly, when the material 12 has a vinyl group or the like, as will be described later, the mold 11 and the material 12 chemically couple with each other and become difficult to be separated when it is imprinted by ultraviolet rays.

Here, it is preferred that a material which is insoluble in a solvent at room temperature (for example, metal, metal oxide, Si, $SiO_2$) be particles and be dispersed in the solvent.

Note that, as will be described later, for improvement in processing quality (anti-etching characteristic) in a mask (composite body of the material 12 and the resist 14, which will be described later), it is desired to use metal, metal oxide, silicon and a compound thereof as the material 12.

As already described, in this embodiment, it is attempted to improve the transfer property by filling the minute recessed portions 111 with the material 12.

For this purpose, it is preferred that the following conditions (1) to (3) be satisfied.

(1) When the material 12 is particles, the particle diameter thereof is sufficiently small with respect to the pattern size (depth and width of the recessed portions 111) (smaller than or equal to pattern dimensions).

Specifically, it is preferred that the diameter of particles (particle diameter) be, for example, less than or equal to 50% of the smaller one of a depth and a width of the recessed portions 111 (a short side or a diameter of the pattern). For example, when the depth and the width (or the diameter) of the recessed portions 111 are 10 nm, the diameter can be about 1 nm to 5 nm for example.

By making the particle diameter to be smaller than or equal to 50% of a pattern short side, plural fine particles can be disposed in the recessed portions 111 (for example, holes), by which the following benefits can be obtained.

When one particle fits in one recessed portion 111 (hole) (that is, the particle diameter is substantially equal to the diameter (hole diameter) of the recessed portion 111), it is possible that a recessed portion 111 in which a particle cannot fit in appears due to small fluctuation in hole diameter and particle diameter or dispersion in embedding conditions. Moreover, when only one particle is disposed in the space in the recessed portion 111, it is difficult to fix the particle to the pattern shape by the resist 14, which will be described later.

As described above, it is desired that plural particles fit in one recessed portion 111 (for example, hole). In this manner, emergence of a recessed portion 111 in which a particle cannot fit in at all, which is due to dispersion of diameters of holes and particles or the like, can be prevented. Further, by the resist 14 entering and curing so as to fill among plural particles in the recessed portion 111, the shape of the pattern can be transferred and maintained accurately.

(2) The viscosity and surface tension of the solution including the material 12 are low (contact angle is 90 degrees or less) to the extent that a capillary action can be exhibited to the pattern (recessed portions 111 and projecting portions 112).

(3) Several conditions are satisfied for that the recessed portions 111 are mostly filled, and deposition would not occur largely on the projecting portions 112 (the layer of the material 12 does not become too thick). These conditions can be realized by adjusting the concentration of the material 12 in the solution (depending on a solvent, for example, diluted to several content % or less), the spin-coating condition (dipping condition in the case of dip-coating), and the evaporation rate of the solvent.

The aspect ratio of the pattern is generally about 0.1 to 10, and thus the depth of the recessed portions 111 is several nm to several tens of nm. The material 12 is diluted to be several % or less by the solvent so that the material 12 does not overflow largely from the recessed portions 111, and is applied on the surface of the mold 11 by the spin coating method or the dipping method.

As the solvent, for example, PGMEA (propylene glycol monomethyl ether acetate) or methanol can be used.

After applying the solution to the mold 11, these solvents may be evaporated naturally or forcibly. Specifically, baking step of heating the solution and evaporating the solvent may be provided (facilitating evaporation of a solvent which evaporates at room temperature, or forcible evaporation of a solvent which is difficult to evaporate at room temperature). In this case, the baking condition (heating temperature or the like) influences the film thickness distribution on the recessed portions 111 and the projecting portions 112 of (3).

Further, a step for removing the material 12 which overflowed from the recessed portions 111 may be provided. For example, the layer of the material 12 on the projecting portions 112 can be removed by etching (etching back) or by CMP (chemical mechanical polishing).

C. Imprint (Steps S13, S14, See FIG. 2C, FIG. 2D)

The mold 11 in which the material 12 is filled in the recessed portions 111 is used to perform imprint. This imprint can be performed through the following steps (1) to (3).

Figure 2C:
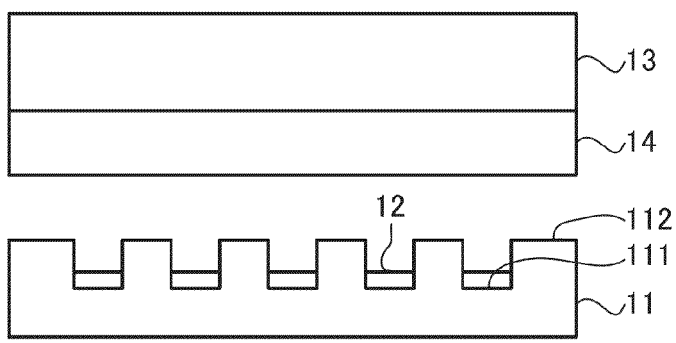

(1) Preparing a Base Material 13 on which the Resist 14 is Applied (Step S13, See FIG. 2C)

A base material 13 on which the resist 14 is applied is prepared. This base material 13 is an object to be processed, for example, using the mold 11 (as an example, it is a magnetic recording medium (substrate on which a magnetic recording layer is formed)). The resist 14 is a thermosetting or an ultraviolet curing resin (for example, an acrylic or epoxy resin).

Figure 2D:
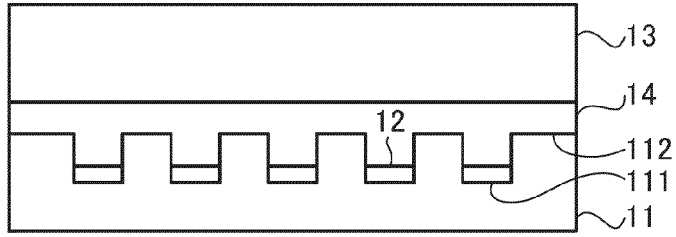
Figure 2E:
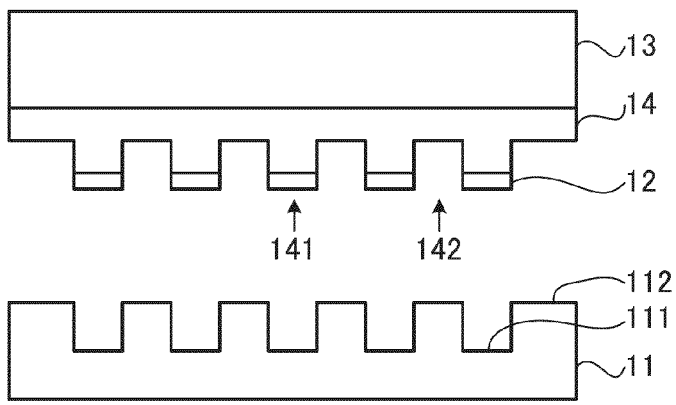

(2) Pressing the Mold 11 Against the Resist 14 (Step S13, See FIG. 2D)

The mold 11 is pressed against the resist 14 on the base material 13. As a result, a projecting and recessed pattern corresponding to the projecting and recessed pattern of the mold 11 is formed on the resist 14 (transfer of pattern).

(3) Curing the Resist 14 (Step S14, See FIG. 2D)

The resist 14 is cured in a state that the mold 11 is pressed. For example, the resist 14 is cured by heat and/or ultraviolet rays.

At this time, the resist 14 cures in a state that the material 12 is engulfed therein. By curing the material 12 in a state that it is engulfed in the resist 14, the pattern of the resist 14 on which the pattern shape of the mold 11 is accurately reflected is formed. That is, a layer of the resist 14 having projecting portions 141 and recessed portions 142 corresponding to the recessed portions 111 and the projecting portions 112 of the mold 11 is formed.

For example, by a capillary phenomenon, the material 12 filled accurately in the recessed portions 111 is taken into the resist 14 and cured (formation of a composite body of the resist 14 and the material 12). Thus, the transfer property becomes good regardless of the characteristics (for example, affinity with the mold 11 or release easiness from the mold 11) of the resist 14.

For the imprint, it is desired to use a UV imprint method which uses an ultraviolet thermosetting resin (acrylic or epoxy resin) as the resist 14 and cures the resist by irradiation of ultraviolet rays.

By using the ultraviolet curing resin as the resist 14, it becomes possible to use a monomer or dimer with a small molecular diameter for the resist 14. The monomer or dimer mixes with the material 12 which is filled in advance, and can secure the transfer property even in a highly minute pattern.

In the process of radical polymerization or cation polymerization by irradiating with ultraviolet rays, the resist 14 cures in the form of engulfing the material 12 which itself does not undergo a polymerization cross-linking reaction, to thereby form the pattern. Thus, good pattern formation accurately reflecting the pattern of the mold 11 becomes possible.

However, thermal imprint may be used instead of the UV imprint. In this case, for example, a thermoplastic resin (plastic material) is used.

D. Separating the Mold 11 from the Base Material 13 (Releasing the Mold 11) (Step S15, See FIG. 2E)

The mold 11 is separated (mold release) from the base material 13. In this mold release step, the mold 11 and the material 12 which weakly adhere are separated. The material 12 does not react with the constituent material of the mold 11. Accordingly, the material 12 and the mold 11 can be separated from each other regardless of the characteristics of the resist 14.

As already described, for example, by a capillary phenomenon, the material 12 filled accurately in the recessed portions 111 is taken into the resist 14 and cures. Accordingly, the transfer property becomes good regardless of the characteristics of the resist 14.

As described above, by filling the material 12 in the recessed portions 111, both the mold release property and the transfer property during imprint can be achieved regardless of the characteristics of the resist 14.

E. Etching the Base Material 13 or Making a New Mold (Step S16, See FIG. 4A to FIG. 4C and FIG. 5A to FIG. 5C)

Next, the resist 14 to which the pattern is transferred (composite body of the resist 14 and the material 12) can be used as a mask for etching the base material 13 or a mold for making a new mold.

E1. Etching the Base Material 13 (Step S16, See FIG. 4A to FIG. 4C)

The resist 14 to which the pattern is transferred (composite body of the resist 14 and the material 12) can be used as a mask for etching the base material 13.

Figure 4A:
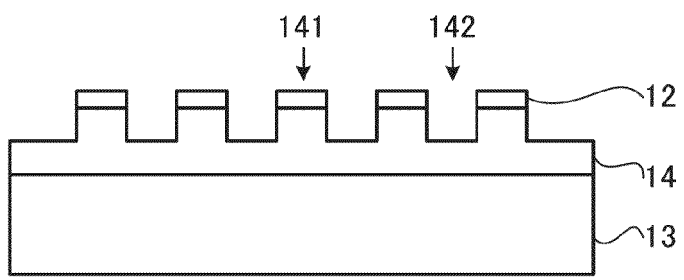
FIGS. 4A-4C are a cross-sectional views representing a base material during etching.
Figure 4B:
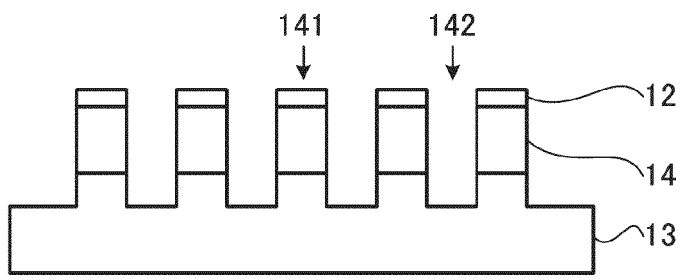

(1) The base material 13 is etched using the resist 14 to which the pattern is transferred (minute processing, see FIG. 4A and FIG. 4B).

The base material 13 is processed by dry etching (for example, RIE (reactive ion etching) with an oxygen gas).

Here, it is possible to improve processing quality during etching with a mask (composite body of the material 12 and the resist 14, which will be described later) by making that the material 12 be not disposed in the recessed portions 142 of the resist 14 (portions corresponding to the projecting portions 112 of the mold 11).

In this case, it is preferred to use as the material 12 a material having a much slower etching rate than the resist 14, such as a metal-based or silica-based material (metal, metal oxide, silicon, silicon compound) or the like. The resist 14 (generally a resin, for example an ultraviolet setting resin) generally has a fast dry etching rate. Accordingly, when the metal-based or silica based material is used as the material 12, it is possible to increase a selection ratio (ratio of the etching rate of the material 12 to the etching rate of the resist 14).

The projecting portions 141 of the resist 14 are made to contain more material 12 with high dry etching resistance. In this manner, the composite body of the resist 14 and the material 12 becomes a very good mask, and processing quality of the base (base material 13) is much more improved than that of the mask of the resist.

Figure 4C:
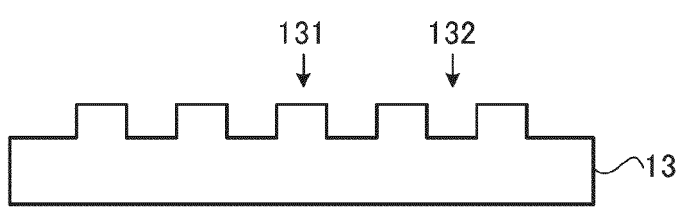
Figure 6A:
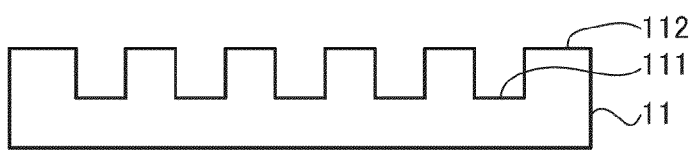
FIGS. 6A-6E are cross-sectional views representing a step of imprint.
Figure 6B:
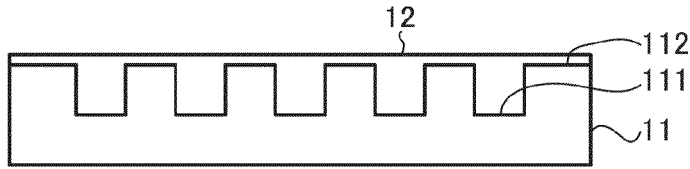
Figure 6C:
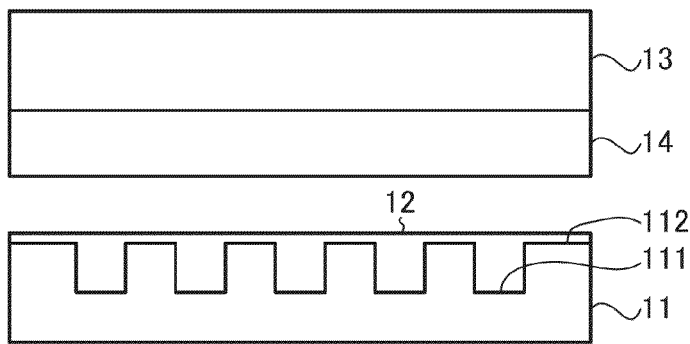
Figure 6D:
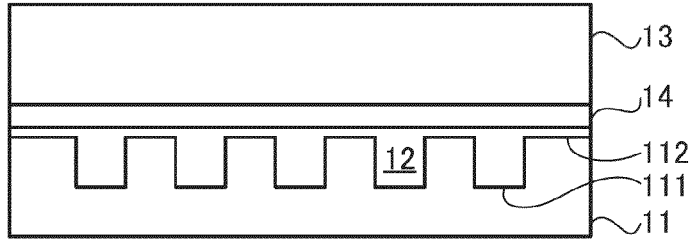
Figure 6E:
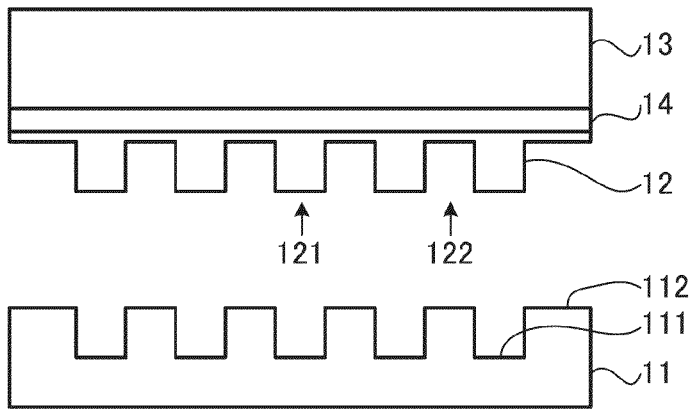

(2) The resist 14 of the mask is removed from the base material 13 after etching (see FIG. 4C). For example, the material 12 and the resist 14 are removed by dry etching with a $CF_4$ gas or a chlorine gas, wet etching by acid or alkali, or the like.

In this manner, the pattern of the mold 11 is transferred to the base material 13. Specifically, projecting portions 131 and recessed portions 132 corresponding to the projecting portions 141 and the recessed portions 142, respectively, of the resist 14 are formed on the base material 13.

As described above, by forming the mask (composite body of the resist 14 and the material 12) having high dry etching resistance at the projecting portions of the pattern, it is possible to improve etching precision of the base material 13. In this case, the metal-based or silica-based material 12 is filled in the recessed portions 111 of the mold 11. As a result, by imprint, the metal-based or silica-based material 12 having a much slower etching rate than the resist 14 is disposed on the projecting portions 141 of the resist 14.

Here, between the base material 13 (for example, the magnetic recording medium) and the resist 14, a hard mask layer may be provided. As the hard mask layer, a C (carbon) layer can be used. In this case, the hard mask layer (and a lift-off layer or the like in some cases) can be removed together with the resist 14 by dry etching or wet etching.

At this time, the patterned resist 14 is formed on the hard mask layer. By using the resist 14 as a mask, for example, the hard mask layer is etched (patterned) by RIE (reactive ion etching) with oxygen gas. With the patterned hardmask layer being a mask, the base material 13 is etched.

In this case, by forming a mask (composite body of the resist 14 and the material 12) having high dry etching resistance at the projecting portions of the pattern, the etching precision of the hard mask layer (moreover, the base material 13) can be improved. In this case, the metal based or silica based material 12 is filled in the recessed portions 111 of the mold 11 as already described. As a result, by imprint, the metal based or silica based material 12 having a much slower etching rate than the resist 14 is disposed on the projecting portions 141 of the resist 14. Accordingly, processing precision of the recessed portions of the resist 14 and the hard mask layer as a base layer thereof improves.

E2. Making a New Mold (Step S16, See FIG. 5A to FIG. 5C)

The resist 14 to which the pattern is transferred (composite body of the resist 14 and the material 12) can be used as a mold for making a new mold. That is, it is conceivable to duplicate the mold 11 in relation with a mass production characteristic.

In this case, the new mold can be made as follows.

(1) Preparing a Base Material 31 on which a Resist 32 is Applied (See FIG. 5A)

A base material 31 on which a resist 32 is applied is prepared. This base material 31 is, for example, a mold material such as quartz, Si, Ni, or plastic. The resist 32 is a thermosetting or an ultraviolet curing resin (for example, an acrylic or epoxy resin).

(2) Pressing the Resist 14 Against the Resist 32 (See FIG. 5B)

The cured resist 14 (composite body of the resist 14 and the material 12) is pressed against the resist 32 on the base material 31. As a result, a projecting and recessed pattern corresponding to the projecting and recessed pattern of the resist 14 is formed on the resist 32 (transfer of pattern).

(3) Curing the Resist 32 (See FIG. 5B)

The resist 32 is cured in a state that the resist 14 is pressed. For example, the resist 32 is cured by heat and/or ultraviolet rays.

At this time, it is desired that the resist 32 and the material 12 do not couple and adhere. Even when the resist 32 and the material 12 couple and adhere, the coupling force of the resist 14 and the material 12 is preferred to be larger than the coupling force of the resist 32 and the material 12.

For this purpose, it is conceivable to (1) use a resist material containing fluorine for the resist 32 for example, or (2) use an epoxy resist for the resist 14 and an acrylic resist for the resist 32. The former can prevent the resist 32 and the material 12 from coupling and adhering. The latter can create a difference in coupling force to the material 12 between the resist 32 and the resist 14.

(4) Separating the Resist 14 from the Base Material 31 (See FIG. 5C)

The composite body of the resist 14 and the material 12 is separated (mold release) from the base material 31. In this mold release step, the resist 32 and the composite body of the resist 14 and the material 12 are separated.

As a result, the resist 32 is patterned. Specifically, recessed portions 321 and projecting portions 322 corresponding to the projecting portions 141 and the recessed portions 142, respectively, of the resist 14 are formed in the resist 32.

The patterned resist 32 can be used as a new mold or mask. For example, the patterned resist 32 can be used as a mask to etch the base material 31.

Modification Examples

In the foregoing, examples of filling the material 12 in the recessed portions 111 of the mold 11 have been illustrated. On the other hand, it is possible to cover both the recessed portions 111 and the projecting portions 112 of the mold 11 with the material 12.

FIG. 6A to FIG. 6E are views representing the step of imprinting in this case, and correspond to FIG. 2A to FIG. 2E. Here, the entire upper face (both the recessed portions 111 and the projecting portions 112) of the mold 11 is covered with the material 12.

This process of imprinting can be represented by the flowchart of FIG. 2. The material 12 do not couple to the material of the mold 11 but is coupled to the resist 14, and thus the mold release property of the mold 11 becomes better (the mold 11 easily separates from the composite body of the resist 14 and the material 12).

(Magnetic Recording Medium)

As already described, the imprint method according to this embodiment can be used for making a magnetic recording medium.

In this case, a magnetic recording medium having a hard mask layer (substrate on which a magnetic recording layer is formed) is used for the base material 13 for example. By imprinting the resist 14 with the mold 11 and processing the hard mask layer and the magnetic recording layer, a magnetic recording medium in which a magnetic layer is processed into a dot shape can be made.

Here, the magnetic recording layer is processed by Ar milling or the like for example. It is not always necessary to etch the magnetic recording layer, and it will suffice if regions where magnetism is deactivated are formed in the magnetic recording layer, creating a state that regions (dots) having magnetism are dispersed.

Thereafter, the processed magnetic recording medium is subjected to processes such as embedding, forming a protective layer and a lubricant layer, surface polishing, and so on for example, to thereby make a bit patterned media (BPM).

Figure 7:
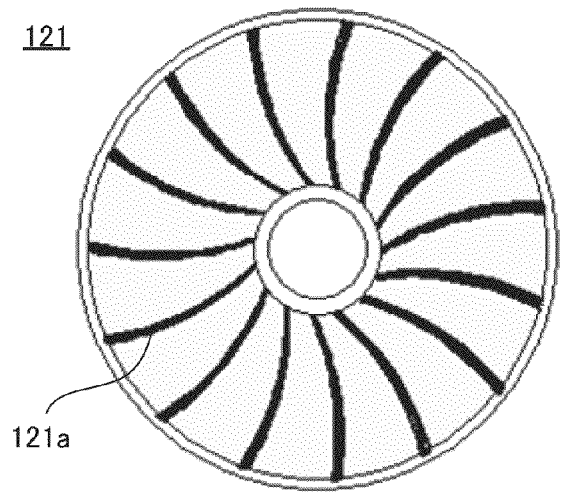
FIG. 7 is a view representing a magnetic recording medium.

For positioning a recording and reproducing head to record information on and reproduce information from the magnetic recording medium, it is necessary to record address information on the magnetic recording medium in advance. The address information is disposed on the magnetic recording medium as a servo pattern. As illustrated in FIG. 7, radial servo pattern regions 121a are disposed at equal intervals on the magnetic disk.

The point that these servo patterns can also be processed at once is one advantage of making the bit patterned media (BPM) by the imprint method. The approach of this embodiment by which both the mold release property and the transfer property are achieved in the imprint process is quite effective in mass production of BPM.

In general, a mold drawn by an electron beam or the like takes several weeks or more to be drawn, and hence it is poor in throughput and is quite expensive. Accordingly, duplicating an expensive master mold by the imprint method and using it as a working mold is considered.

In this case, the mold 11 can be duplicated by the method illustrated in the modification example. A large amount of the material 12 with a good mold release property is exposed on the surface of the working mold (composite body of the resist 14 and the material 12), and thus release of the working mold is easy even though a release agent is not used.

The approach of this embodiment can also be applied to a magnetic recording medium called an ordered medium. In the ordered medium, one mark is formed of several dots, which is different from the bit patterned medium (one mark corresponds to one dot). When individual dots are isolated in a sufficiently small manner and are arranged precisely, marks with higher quality can be formed than in a conventional granular continuous film medium. The granular continuous film medium is an aggregate of relatively random magnetic domains, and is limited in terms of shape and thermal fluctuation resistance.

To correspond to a next generation recording density by this ordered medium, it is necessary to have a dot pitch of 10 nm or less. As a manufacturing measure for this medium, the imprint method with a mold is considered.

At this time, problems such as achieving both the mold release property and the transfer property are the same as in the BPM medium, and hence the imprint process according to this embodiment is also effective for the ordered medium.

(Magnetic Recording and Reproducing Device)

Figure 8:
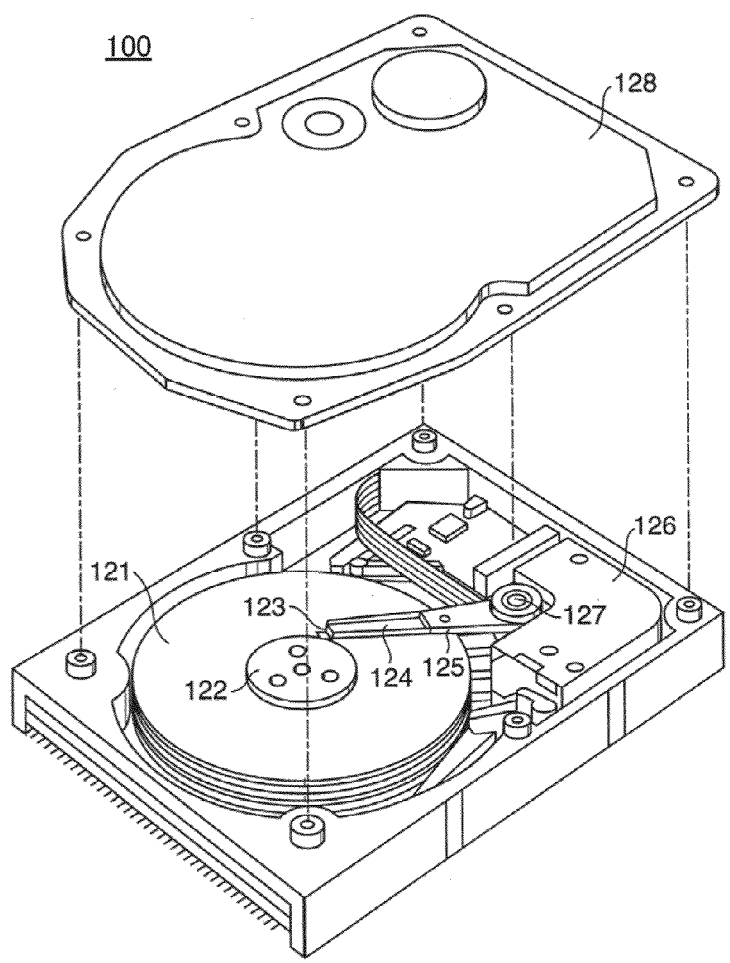
FIG. 8 is a view representing a magnetic recording and reproducing device.

FIG. 8 is a perspective view representing a magnetic recording and reproducing device 100 according to the embodiment. The magnetic recording and reproducing device 100 has a magnetic disk 121, a spindle 122, a slider 123, a suspension 124, an arm 125, a voice coil motor 126, and a cover 128.

The magnetic disk 121 is a bit patterned type magnetic recording medium (BPM) of this embodiment. The magnetic disk 121 is mounted on the spindle 122, and is driven to rotate at a constant rotation speed by a not-illustrated spindle motor. As already described, servo patterns in which address information is recorded are disposed radially on the magnetic disk 121, thereby allowing positioning of a recording and reproducing head.

The slider 123 accesses the magnetic disk 121 to record or reproduce information. The slider 123, on which a single-pole magnetic head for recording and an MR head for reproducing are mounted for example, is attached to the tip of the suspension 124 formed of a leaf spring having a thin plate shape.

The suspension 124 is connected to one end of the arm 125 having a bobbin part retaining a driving coil and so on, which are not illustrated. On the other end of the arm 125, the voice coil motor 126 which is one type of linear motor is provided.

The voice coil motor 126 is formed of a driving coil and a magnetic circuit, which are not illustrated. The driving coil is wound on the bobbin part of the arm 125. The magnetic circuit is formed of a permanent magnet and an opposing yoke, which are disposed to oppose each other with the driving coil being interposed therebetween.

The arm 125 is retained by not-illustrated ball bearings provided at two, upper and lower positions of a fixed shaft 127, and is rotary and swingably driven by the voice coil motor 126. Specifically, the position of the slider 123 on the magnetic disk 121 is controlled by the voice coil motor 126.

(Semiconductor Device)

The imprint method according to this embodiment can be applied in the semiconductor field to produce semiconductor devices. During production of semiconductor devices, attempts are being made to form and duplicate minute wirings precisely in a short time by the imprint process.

Particularly, the width of wiring is approximately 10 nm in the next generation and thereafter, and thus there is a concern that patterns are embedded in release processing with a mold release layer. Further, when a water repellent resist which does not require the mold release layer is used, the resist does not enter the pattern, and it is possible that the pattern would not be transferred.

Also in the semiconductor field, it is effective to achieve both the mold release property and the transfer property in the imprint process according to this embodiment, and simultaneously improve the dry etching resistance of a mask.

Example 1

Experimental examples will be described.
(1) Filling the Material 12 in the Mold 11

$SiO_2$ which is a silica-based chemical compound was filled as the material 12 in holes (recessed portions 111) of the mold 11 having a hole pattern with a diameter of about 15 nm and a depth of about 20 nm. The $SiO_2$ can be diluted with a solvent such as PGMEA (polypropylene glycol monomethyl ether acetate) or methanol and applied by a spin coating method.

(2) Imprint and Mold Release

Thereafter, using this mold 11, UV imprint was performed on a magnetic recording medium (base material 13) with an ultraviolet curing acrylic resin (resist 14). After the mold 11 is released, the pattern transferred to the acrylic resin (resist 14) is measured by AFM (atomic force microscope).

Figure 9A:
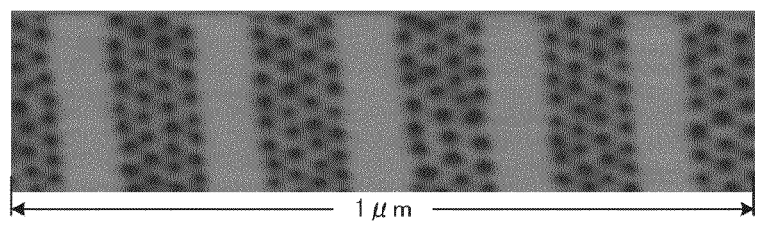
FIGS. 9A-9C are views illustrating an AFM image.
Figure 9B:
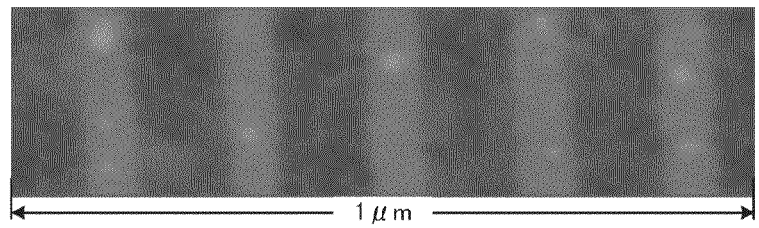
Figure 9C:
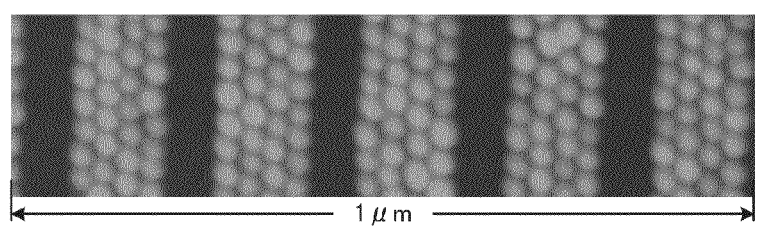

FIG. 9A to FIG. 9C are AFM images of (1) the mold 11 itself, (2) the mold 11 in which the $SiO_2$ (material 12) is filled, and (3) the acrylic resin (resist 14) to which the pattern is transferred.

As illustrated in FIG. 9A to FIG. 9C, it was confirmed that a mask pattern is imprinted which excels in mold release property and transfer property and is faithful to the mold.

As described above, in the imprint process of this embodiment, the mold non-reactive material 12 is filled in the recessed portions 111 of the mold 11 (for example, quartz, Si, Ni, plastic) on which mold release processing is not performed.

For the mold non-reactive material 12, for example, it is possible to use a low molecular weight polymer which does not have a reaction group which reacts with a metal-based or silicon-based material or a mold material, and which does not undergo a polymerization or cross-linking reaction. For example, the mold non-reactive material 12 can be solved in a solvent and applied onto the mold 11, to thereby fill the mold non-reactive material 12 in the recessed portions 111 thereof.

Thereafter, the mold 11 in which the material 12 is filled is used to perform imprint (more desirably, UV imprint) on the base material 13 (magnetic recording medium in the case of BPM) and the resist 14 (for example, the ultraviolet curing resin). At this time, the material 12 and the material of the mold 11 do not react, and thus even the mold 11 on which mold release processing is not performed can be released at the interface with the material 12. Further, since the resist 14 cures while engulfing the material 12 therein, the transfer property of the pattern is good as long as the material 12 is filled completely.

In this manner, it is possible to achieve both the mold release property and the transfer property during the imprint.

In this embodiment, the mold release property during the imprint can be secured without performing the mold release processing which impairs a pattern shape. Further, also deterioration in transfer property does not occur, which occurs by using a water repellent resist for mold releasing. It is possible to achieve both the mold release property and the transfer property during the imprint.

Moreover, by using a metal-based or silica-based material for the material 12 and filling the material 12 selectively in the recessed portions 111 of the mold 11, an ideal mask (composite body of the material 12 and the resist 14) with high etching resistance at the projecting portions 141 can be formed. Metal-based or silica-based materials are much slower in etching rate than the resist 14. The material 12 selectively filled in the recessed portions 111 of the mold 11 become the projecting portions 141 of the composite body of the material 12 and the resist 14 after the imprint. As a result, the composite body of the material 12 and the resist 14 can be used as an ideal mask with high dry etching resistance at pattern portions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint method, comprising:
preparing a mold having a recessed portion;
at least partly filling the recessed portion with a mold non-reactive material which does not chemically react with a material of the mold;
pressing the mold against a resist, the resist being applied on a base material;
curing the resist in a state that the mold is pressed to cause coupling of the resist and the mold non-reactive material and to form a recessed portion and a projecting portion on the cured resist, the projecting portion being covered with the mold non-reactive material; and
separating the mold from the base material to leave the resist and the mold non-reactive material on the base material.

2. The imprint method according to claim 1,
wherein the recessed portion has a width and a depth of 5 nm or more and 100 nm or less.

3. The imprint method according to claim 1,
wherein the curing of the resist includes irradiating the resist with an ultraviolet ray.

4. The imprint method according to claim 1,
wherein the filling includes applying a solution containing the mold non-reactive material onto the mold.

5. The imprint method according to claim 4,
wherein the solution further includes a solvent, and
the filling further includes evaporating the solvent.

6. The imprint method according to claim 1,
wherein the material of the mold includes quartz, Si, Ni, or plastic.

7. The imprint method according to claim 6,
wherein the mold non-reactive material is one of metal, metal oxide, metal complex, or silica compound or an organic compound which does not have a reaction group which reacts with the material of the mold.

8. The imprint method according to claim 7,
wherein the metal, metal oxide, and metal complex includes Au, Ag, Cu, Al, Fe, Co, Pt, Ni, W, or Mo;
wherein the silica compound is Si, $SiO_2$, or silsesquioxane; and
wherein the reaction group is a vinyl group, an epoxy group, an amino group, a methacrylic group, a mercapto group, and an oxetanyl group.

9. The imprint method according to claim 7,
wherein the mold non-reactive material is metal, metal oxide, or silica compound.

10. The imprint method according to claim 1,
wherein the mold non-reactive material is particles having a diameter of 50% or less of a width or a depth of the recessed portion.

11. The imprint method according to claim 10,
wherein each of the particles has a diameter of 1 nm or more and 10 nm or less.

12. An imprint method, comprising:
preparing a mold having a recessed portion;
filling the recessed portion with a mold non-reactive material which does not chemically react with a material of the mold;
pressing the mold against a resist, the resist being applied on a base material;
curing the resist in a state that the mold is pressed to cause coupling of the resist and the mold non-reactive material and to form a recessed portion and a projecting portion on the cured resist, both of the recessed portion and the projecting portion being covered with the mold non-reactive material; and
separating the mold from the base material to leave the resist and the mold non-reactive material on the base material.

13. The imprint method according to claim 12,
wherein the recessed portion has a width and a depth of 5 nm or more and 100 nm or less.

14. The imprint method according to claim 12,
wherein the curing of the resist includes irradiating the resist with an ultraviolet ray.

15. The imprint method according to claim 12,
wherein the filling includes applying a solution containing the mold non-reactive material onto the mold.

16. The imprint method according to claim 15,
wherein the solution further includes a solvent, and
the filling further includes evaporating the solvent.

17. The imprint method according to claim 12,
wherein the material of the mold includes quartz, Si, Ni, or plastic.

18. The imprint method according to claim 17,
wherein the mold non-reactive material is one of metal, metal oxide, metal complex, or silica compound or an organic compound which does not have a reaction group which reacts with the material of the mold.

19. The imprint method according to claim 18,
wherein the metal, metal oxide, and metal complex includes Au, Ag, Cu, Al, Fe, Co, Pt, Ni, W, or Mo;
wherein the silica compound is Si, $SiO_2$, or silsesquioxane; and
wherein the reaction group is a vinyl group, an epoxy group, an amino group, a methacrylic group, a mercapto group, and an oxetanyl group.

20. The imprint method according to claim 18,
wherein the mold non-reactive material is metal, metal oxide, or silica compound.

* * * * *